(12) United States Patent
Konishi et al.

(10) Patent No.: US 6,855,389 B2
(45) Date of Patent: Feb. 15, 2005

(54) PHOTOPOLYMERIZABLE RESIN COMPOSITIONS FOR OPTICAL RECORDING MEDIA AND OPTICAL RECORDING MEDIA

(75) Inventors: Misao Konishi, Kanuma (JP); Yoshiaki Nakata, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 22 days.

(21) Appl. No.: 10/110,244

(22) PCT Filed: Jul. 25, 2001

(86) PCT No.: PCT/JP01/06398

§ 371 (c)(1),
(2), (4) Date: Apr. 10, 2002

(87) PCT Pub. No.: WO02/14386

PCT Pub. Date: Feb. 21, 2002

(65) Prior Publication Data

US 2003/0039795 A1 Feb. 27, 2003

(30) Foreign Application Priority Data

Aug. 11, 2000 (JP) ........................................ 2000-243619

(51) Int. Cl.$^7$ ................................................. B32B 3/02
(52) U.S. Cl. .................... 428/64.1; 428/64.4; 428/65.2; 430/270.11
(58) Field of Search ................................ 428/64.1, 64.4, 428/65.2, 522, 913; 430/270.11, 495.1, 945

(56) References Cited

U.S. PATENT DOCUMENTS 5,258,225 A * 11/1993 Katsamberis ............... 428/331

6,472,451 B2 * 10/2002 Ha ............................. 522/97

FOREIGN PATENT DOCUMENTS

| EP | 0 706 178 A2 | 4/1996 | ............ G11B/7/26 |
|---|---|---|---|
| JP | 4-175315 | 6/1992 | ............ C08F/20/38 |
| JP | 5-59138 | 3/1993 | ......... C08F/299/06 |
| JP | 5/86152 | 4/1993 | ......... C08F/299/02 |
| JP | 5-109118 | 4/1993 | ............ G11B/7/24 |
| JP | 5-255619 | 10/1993 | ............ C09D/5/32 |
| JP | 6-220131 | 8/1994 | ............ C08F/20/28 |
| JP | 7-62267 | 3/1995 | ............ C09D/4/02 |
| JP | 9-63122 | 3/1997 | ............ G11B/7/24 |
| JP | 9-161318 | 6/1997 | ............ G11B/7/24 |
| JP | 9-235311 | 9/1997 | ............ C08F/2/50 |
| JP | 9-286809 | 11/1997 | ............ C08F/2/50 |
| JP | 10-287718 | 10/1998 | ......... C08F/290/06 |
| JP | 2000-3531 | 1/2000 | ............ G11B/7/24 |
| WO | WO 00/09620 | 2/2000 | ............ C09J/4/06 |

OTHER PUBLICATIONS

Translation of The PCT International Preliminary Examination Report dated Aug. 6, 2002, 5 pages.

* cited by examiner

Primary Examiner—Elizabeth Mulvaney
(74) Attorney, Agent, or Firm—Osha & May L.L.P.

(57) ABSTRACT

The present invention relates to photopolymerizable resin composition inducing substantially no chemical degradation in metals in tight contract with the resin. Further, the present invention relates to optical recording media using the photopolymerizable resins. In one embodiment, a photopolymerizable resin composition includes a photopolymerizable resin based on acrylic ester, and an additive based on at least one selected from the group consisting of benzotriazole and a derivative of benzotriazole, and a photointiator.

15 Claims, 3 Drawing Sheets

PHOTOPOLYMERIZABLE RESIN COMPOSITIONS FOR OPTICAL RECORDING MEDIA AND OPTICAL RECORDING MEDIA

TECHNICAL FIELD

The present invention relates to photopolymerizable resins used in optical recording media, particularly photopolymerizable resin compositions used for bonding two substrates.

BACKGROUND ART

Conventional media for reading or reading/writing memory data by using light include optical recording media such as compact disks and DVDs (Digital Versatile Discs).

As an example of these media, reference 100 in FIG. 4 represents an optical recording medium used as a DVD, comprising first and second substrates 111, 121, first and second reflective films 115, 125 and a resin layer 140.

First reflective film 115 is formed on a surface of first substrate 111, and resin layer 140 is provided in tight contact with the side of first reflective film 115 opposite to first substrate 111. Second reflective film 125 is provided in tight contact with the side of resin layer 140 opposite to first reflective film 115, and second substrate 121 is provided on the side of second reflective film 125 opposite to resin layer 140.

Generally, resin layer 140 consists of a cured product of a photopolymerizable resin such as epoxy acrylate, in which impure ions such as chlorine ion are liable to remain during its preparation process and any impure ions or water remaining in resin layer 140 may chemically degrade reflective films 115, 125 in tight contact with resin layer 140.

Especially, on reflective films consisting of a thin metal film based on silver, chemical degradation such as oxidation or sulfurization is liable to be caused and degraded reflective films 115, 125 discolor to no longer serve as reflective films.

In order to prevent such chemical degradation, JPA No. 126370/1999 describes a method for protecting reflective films from a resin layer by forming a protective film consisting of silicon dioxide or the like on the surfaces of the reflective films and bringing the resin layer into tight contact with the surface of the protective film.

However, such a protective film had the disadvantage that a more complex process is required for manufacturing an optical recording medium and high costs are incurred.

The present invention was made to overcome the disadvantages of the prior art described above with the purpose of providing a photopolymerizable resin composition suitable for a resin layer formed in tight contact with reflective films of optical recording media.

DISCLOSURE OF THE INVENTION

The present invention provides a photopolymerizable resin composition containing a photopolymerizable resin based on an acrylic ester, an additive based on either one or both of benzotriazole and a benzotriazole derivative, and a photoinitiator.

In the photopolymerizable resin composition of the present invention, the additive is contained at 0.01 parts by weight or more per 100 parts by weight of the total weight of the photopolymerizable resin and the photoinitiator.

In the photopolymerizable resin composition of the present invention, the additive is contained at 0.05 parts by weight or more and 5 parts by weight or less per 100 parts by weight of the it's total weight of the photopolymerizable resin and the photoinitiator.

In the photopolymerizable resin composition of the present invention, the additive is based on either one or both of 1,2,3-benzotriazole and a derivative of 1,2,3-benzotriazole.

The present invention also provides an optical recording medium comprising a substrate, a first reflective film provided on the substrate and a resin layer provided in tight contact with the first reflective film wherein the resin layer consists of a photopolymerizable resin composition containing a photopolymerizable resin based on an acrylic ester, an additive based on either one or both of benzotriazole and a derivative of benzotriazole, and a photoinitiator.

In the optical recording medium of the present invention, a second reflective film is in tight contact with the surface of the resin layer opposite to the side with which the first resin film is in tight contact.

In the optical recording medium of the present invention, the first reflective film is based on silver.

In the optical recording medium of the present invention, the resin layer has a thickness in the range of 1 μm or more and 200 μm or less.

Figure 1A:
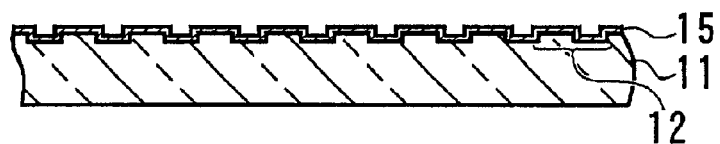
FIGS. 1a, 1b, 1c, and 1d are diagrams for illustrating a process for manufacturing a first example of an optical recording medium of the present invention.

Various references in the drawings represent the following elements: 1, 50, 70, optical recording medium; 11, 21, 51, 71, substrate (first or second substrate); 15, 25, 55, 75, reflective film (first or second reflective film); 35, 65, 76, resin layer (protective film).

THE MOST PREFERRED EMBODIMENTS OF THE INVENTION

Photopolymerizable resin compositions of the present invention contain an additive such as benzotriazole or a benzotriazole derivative serving to protect metals against chemical degradation, so that no chemical degradation occurs in reflective films consisting of a chemically unstable metal such as silver even when a resin layer consisting of a photopolymerizable resin composition of the present invention is directly brought into tight contact with the reflective films.

If either one of first or second reflective film of optical recording media of the present invention consists of a transmissive material, even a laser beam emitted from the side of the substrate having the transmissive reflective film can be directed to the other reflective film to read data because the laser beam can pass through the transmissive reflective film to reach the other reflective film.

Such photopolymerizable resin compositions can be applied on a reflective film on a surface of a substrate and then cured by UV irradiation to form a protective film of an optical recording medium such as a compact disk.

Photopolymerizable resin compositions and optical recording media of the present invention are explained in detail below.

Initially, a photopolymerizable resin was prepared by adding 24 parts by weight each of acrylic esters, ie., dicyclopentadiene diacrylate (sold under the name of "R684" by Nippon Kayaku Co., Ltd.), EO-modified trimethylolpropane triacrylate (sold under the name of "SR351" by Sartomer Company Inc.) and tripropylene glycol diacrylate (sold under the name of "SR306" by Sartomer Company Inc.) to 24 parts by weight of an urethane acrylate oligomer (sold under the name of "CN983" by Sartomer Company Inc.).

To this photopolymerizable resin were added and mixed 4 parts by weight of a photoinitiator (sold under the name of "Irgacure 184" by Ciba Specialty Chemicals K.K.) and 0.5 parts by weight of an additive 1,2,3-benzotriazole to prepare a photopolymerizable resin composition of Example 1.

Figure 1B:
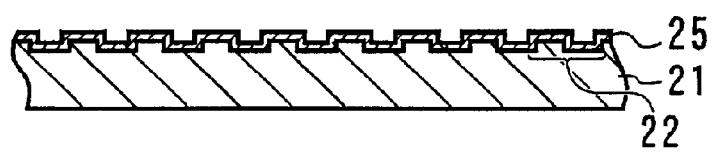

References 11, 21 in FIGS. 1(a), 1(b) represent first and second substrates, respectively, used in an optical recording medium of the present invention.

Pits 12, 22 are formed on one side of first and second substrates 11, 21, respectively, and first and second reflective films 15, 25 are formed by sputtering on the surfaces of these pits 12, 22, respectively.

First and second reflective films 15, 25 have a thickness smaller than the height of pits 12, 22 so that the pattern of pits 12, 22 is reflected on reflective films 15, 25.

First substrate 11 here consists of a transmissive polycarbonate resin and first reflective film 15 formed on first substrate 11 consists of a semi-transmissive metal film based on silver. Second reflective film 25 formed on second substrate 21 consists of a metal film based on aluminum.

In order to prepare an optical recording medium of the present invention using first and second substrates 11, 21 as described above and the photopolymerizable resin composition of Example 1 as described above, the photopolymerizable resin composition is first dropped on the surface of first reflective film 15 formed on first substrate 11, then second reflective film 25 formed on second substrate 21 is brought into tight contact with the surface of the first reflective film 15, and then the photopolymerizable resin composition is uniformly spread over the surface of first reflective film 15 by spin coating to prepare a resin composition layer consisting of the photopolymerizable resin composition between first and second reflective films 15, 25.

Figure 1C:
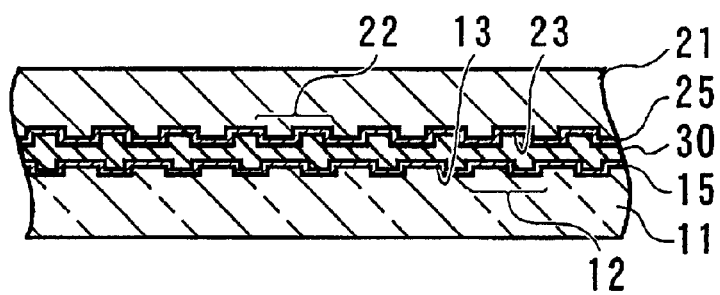

Reference 30 in FIG. 1(c) represents the resin composition layer, which is provided in tight contact with the surfaces of first and second reflective films 15, 25.

Then, the surface of first substrate 11 in this state is irradiated with UV rays. When UV rays pass through transparent first substrate 11 to reach resin composition layer 30, the photopolymerizable resin composition forming resin composition layer 30 is polymerized by UV rays so that resin composition layer 30 is cured while resin composition layer 30 is in tight contact with first and second reflective films 15, 25. Thus, first and second reflective films 15, 25 on the surfaces of first and second substrates 11, 21 are bonded together by cured resin composition layer 30.

Figure 1D:
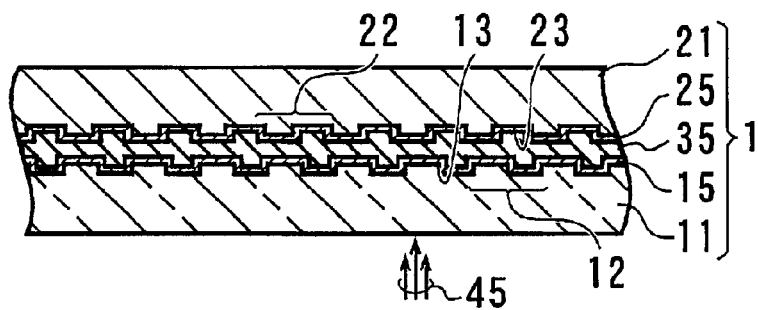

Reference 1 in FIG. 1(d) represents an optical recording medium formed by bonding first and second reflective films 15, 25.

A resin layer 35 formed of cured resin composition layer 30 is provided between first and second substrates 11, 21 of optical recording medium 1, and resin layer 35 is in tight contact with first and second reflective films 15, 25 formed on the surfaces of first and second substrates 11, 21.

Data in optical recording medium 1 is recorded as pits 12, 22 on the surfaces of first and second substrates 11, 21 and read by directing a laser beam 45 at a predetermined wavelength (a red laser beam at a wavelength of 650 nm or a blue laser beam at a wavelength of 440 nm) to the surface of first substrate 11 of optical recording medium 1 (FIG. 1(d)).

When laser beam 45 is condensed on the interface 13 between first substrate 11 and first reflective film 15 (a first data reading face), the beam reflected by reflective film 15 varies in intensity with the pattern of pits 12 on first substrate 11.

Thus, data recorded as pits 12 on the surface of first substrate 11 can be read by detecting variations in the intensity of the reflected beam.

On the other hand, data recorded as pits 22 on the surface of second substrate 21 can also be read by directing laser beam 45 to the surface of first substrate 11 of optical recording medium 1, as described for first data reading face 13.

Laser beam 45 partially passes through first reflective film 15 formed on the surface of first substrate 11 because first reflective film 15 is suitably transmissive to laser beams at a predetermined range of wavelength.

After having passed through first substrate 11 and first reflective film 15, laser beam 45 reaches second reflective film 25 without being refracted or scattered in resin layer 35 because resin layer 35 provided in tight contact with first reflective film 15 has a refractive index nearly equal to that of first substrate 11.

The data can also be read from the interface 23 between second reflective film 25 and resin layer 35 (a second data reading face) by condensing the laser beam on second data reading face 23 and detecting varies in the intensity of the beam reflected by reflective film 25 because the pattern of pits 22 on the surface of second substrate 21 is reflected on second reflective film 25 (single-sided reproduction).

This optical recording medium 1 was subjected to a "high temperature/high humidity test" below.

<High Temperature/High Humidity test>

Optical recording medium 1 formed by the process above was left for 50 hours under the conditions of 85° C., relative humidity 95% (high temperature/high humidity storage), after which the state of first reflective film 15 of optical recording medium 1 was observed. The results are shown in Table 1 below in the column of "state of reflective film/general aspect" in which "○" means that first reflective film 15 generally maintains the same silver color as before high temperature/high humidity storage and "x" means that it generally changes into a dark color. Separately, discolored black spots localized on first reflective film 15 are counted and the number of discolored spots is shown in Table 1 below in the column of "state of reflective film/number of discolored spots".

The results of "total evaluation" in the "high temperature/high humidity test" are also shown in Table 1 below in which "○" means that first reflective film 15 contains less than 50 discolored spots, "Δ" means that first reflective film 15 contains 50 or more discolored spots but generally maintains the silver color, and "x" means that first reflective film 15 contains 50 or more discolored spots and changes into black.

TABLE 1

Types of additives and high temperature/high humidity test results

| | | | State of reflective film | | |
|---|---|---|---|---|---|
| | Protective additive | Chemical formula | General aspect | Number of disclolored spots | Total evaluation |
| Example 1 | Benzotriazole | Formula (1) | ○ | 0 | ○ |
| Example 2 | Methylbenzotriazole | Formula (2) | ○ | 0 | ○ |
| Example 3 | 1-(N,N-Bis(2-ethylhexyl)aminomethyl)benzotriazole | Formula (3) | ○ | 5 | ○ |
| Example 4 | Carboxybenzotriazole | Formula (4) | ○ | 3 | ○ |
| Example 5 | 3-(N-Salicyloyl)amino-1,2,4-triazole | Formula (5) | X | 10 | ○ |
| Comparative Example 1 | 2-Mercaptobenzothiazole | Formula (6) | X | 50 or more | X |
| Comparative Example 2 | 2-Methylimidazole | Formula (7) | X | 50 or more | X |
| Comparative Example 3 | 2-Methyl-4-ethylimidazole | Formula (8) | X | 50 or more | X |
| Comparative Example 4 | 2-Undecylimidazole | Formula (9) | X | 50 or more | X |
| Comparative Example 5 | 2-Heptadecylimidazole | Formula (10) | X | 50 or more | X |
| Comparative Example 6 | 2-Phenylimidazole | Formula (11) | ○ | 50 or more | Δ |
| Comparative Example 7 | 1-Cyanoethyl-2-methylimidazole | Formula (12) | X | 50 or more | X |
| Comparative Example 8 | 1-Cyanoethyl-2-ethyl-4-methylimidazole | Formula (13) | X | 50 or more | X |
| Comparative Example 9 | 1-Cyanoethyl-2-phenylimidazole | Formula (14) | X | 50 or more | X |
| Comparative Example 10 | 1-Cyanoethyl-2-undecylimidazole | Formula (15) | X | 50 or more | X |
| Comparative Example 11 | — | — | ○ | 50 or more | Δ |

EXAMPLES 2–5

Methylbenzotriazole was used as an additive in place of 1,2,3-benzotriazole used in Example 1 and mixed with the photopolymerizable resin and photoinitiator used in Example 1 in the same proportions as in Example 1 to prepare a photopolymerizable resin composition of Example 2.

The photopolymerizable resin composition of Example 2 was used in combination with first and second substrates 11, 21 in the state shown in FIGS. 1(*a*), (*b*) to prepare an optical recording medium 1 of Example 2 by the same process as in Example 1.

Similarly to Example 2, 1-(N,N-bis(2-ethylhexyl)aminomethyl)benzotriazole, carboxybenzotriazole and 3-(N-salicyloyl)amino-1,2,4-triazole were used as additives in place of 1,2,3-benzotriazole used in Example 1 to prepare photopolymerizable resin compositions of Examples 3–5 and optical recording media 1 of Examples 3–5 using them.

These optical recording media 1 of Examples 2–5 were subjected to the "high temperature/high humidity test" under the same conditions as in Example 1 and the test results are shown in Table 1 above.

The additives used in Examples 2–4 are 1,2,3-benzotriazole derivatives and the additive used in Example 5 is a 1,2,4-benzotriazole derivative. The compounds forming the additives used in Examples 2–5 (formula (2)–(5)) and the additive used in Example 1 (formula (1)) are represented by the chemical formulae below.

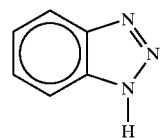

Chemical Formula (1)

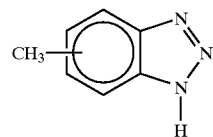

Chemical Formula (2)

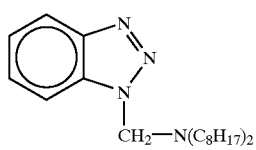

Chemical Formula (3)

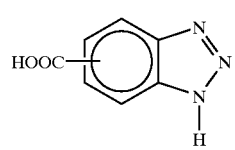

Chemical Formula (4)

Chemical Formula (5)

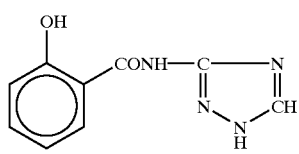

COMPARATIVE EXAMPLES 1–11

Similarly to Example 2, 2-mercaptobenzothiazole, 2-methylimidazole, 2-methyl-4-ethylimidazole, 2-undecylimidazole, 2-heptadecylimidazole, 2-phenylimidazole, 1-cyanoethyl-2-methylimidazole, 1-cyanoethyl-2-ethyl-4-methylimidazole, 1-cyanoethyl-2-phenylimidazole and 1-cyanoethyl-2-undecylimidazole were used as additives in place of 1,2,3-benzotriazole used in Example 1 to prepare photopolymerizable resin compositions of Comparative examples 1–10 and optical recording media 1 of Comparative examples 1–10 using them.

Separately, the photopolymerizable resin and photoinitiator used in Example 1 were mixed in the same proportions as in Example 1 with no additives to prepare a photopolymerizable resin composition of Comparative example 11 and an optical recording medium of Comparative example 11.

These optical recording media of Comparative examples 1–11 were subjected to the "high temperature/high humidity test" under the same conditions as in Example 1 and the test results are shown in Table 1 above. The additives used in Comparative examples 1–10 are represented by chemical formulae (6)–(15) below.

Chemical Formula (6)

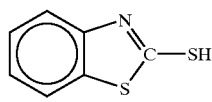

Chemical Formula (7)

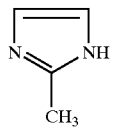

Chemical Formula (8)

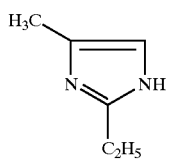

Chemical Formula (9)

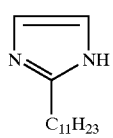

Chemical Formula (10)

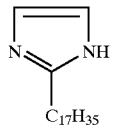

Chemical Formula (11)

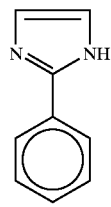

Chemical Formula (12)

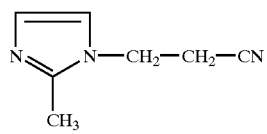

Chemical Formula (13)

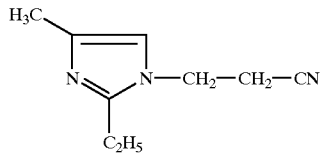

Chemical Formula (14)

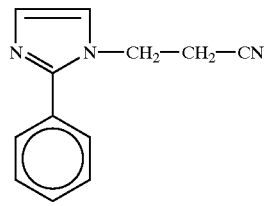

Chemical Formula (15)

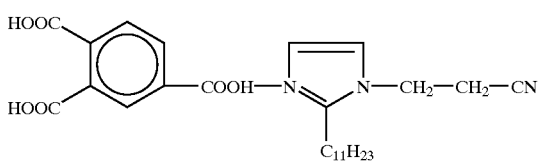

The additive used in Comparative example 1 is a derivative of thiazole and the additives used in Comparative examples 2–10 are derivatives of imidazole.

As shown in Table 1 above, less discolored spots occurred in optical recording media 1 using the photopolymerizable resin compositions of Examples 1–5 than using the photopolymerizable resin compositions of Comparative examples 1–10 in the "high temperature/high humidity test". Especially, very few discolored spots occurred in Examples 1–4 using 1,2,3-benzotriazole or a derivative thereof as an additive.

EXAMPLES 6–12

The photopolymerizable resin and photoinitiator used in Example 1 were mixed in the same proportions as in Example 1 and combined with the additive used in Example 1 in varying amounts (parts by weight) as shown in Table 2 below to prepare photopolymerizable resin compositions of Examples 6–12.

The photopolymerizable resin compositions of Examples 6–12 were used to prepare optical recording media 1 of Examples 6–12 by the same process as in Example 1. These optical recording media 1 were subjected to the "high temperature/high humidity test" under the same conditions as in Example 1. The results are shown in Table 2 below.

TABLE 2

Amounts of additive and high temperature/high humidity test results

| | | State of reflective film | |
|---|---|---|---|
| | Amount of additive (parts by weight) | General aspect | Number of discolored spots | Total evaluation |
| Example 6 | 10 | X | 0 | Δ |
| Example 7 | 8 | X | 0 | Δ |
| Example 8 | 5 | ○ | 0 | ○ |
| Example 9 | 3 | ○ | 0 | ○ |
| Example 10 | 1 | ○ | 0 | ○ |
| Example 1 | 0.5 | ○ | 0 | ○ |
| Example 11 | 0.05 | ○ | 2 | ○ |
| Example 12 | 0.01 | ○ | 11 | ○ |
| Comparative Example 11 | None | ○ | 50 or more | Δ |

In Table 2 above, the results of the "high temperature/high humidity test" on Comparative example 11 described above are also shown.

As shown in Table 2 above, less local discolored spots occurred in optical recording media 1 using the photopolymerizable resin compositions of Examples 6–12 as compared with Comparative example 11.

Especially, very few discolored spots were observed when the photopolymerizable resin compositions of Example 1 and 8–11 were used in which the amount of the additive is in the range of 0.05 parts by weight or more and 5 parts by weight or less per 100 parts by weight of the total weight of the photopolymerizable resin and the photoinitiator.

Example 12 showed eleven local discolored spots but no general discoloration, confirming that an anti-degradation effect is obtained so far as the amount of the additive is 0.01 parts by weight or more per 100 parts by weight of the total weight of the photopolymerizable resin and the photoinitiator.

Another example of an optical recording medium of the present invention is described in detail below.

Initially, a photopolymerizable resin was prepared by mixing 32 parts by weight each of acrylic esters, ie, dicyclopentadiene diacrylate, trimethylolpropane triacrylate and tripropylene glycol diacrylate.

To this photopolymerizable resin were added and mixed 4 parts by weight of a photoinitiator (sold under the name of "Irgacure 184" by Ciba Specialty Chemicals K.K.) and 0.5 parts by weight of an additive 1,2,3-benzotriazole to prepare a photopolymerizable resin composition of Example 13.

Figure 2A:
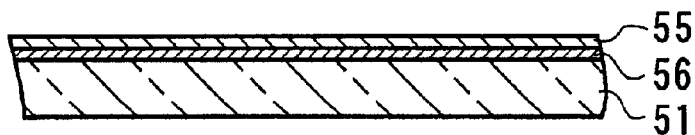
FIGS. 2a, 2b, 2c, and 2d are diagrams for illustrating a second example of an optical recording medium of the present invention together with the manufacturing process.

Reference 51 in FIG. 2(a) represents a transparent substrate. Substrate 51 used here consists of a polycarbonate resin. A pigment layer 56 is formed on the surface of substrate 51, and a reflective film 55 is formed on the surface of pigment layer 56. Reflective film 55 here consists of a metal thin film based on silver.

In order to prepare an optical recording medium of the present invention using substrate 51 in this state, the photopolymerizable resin composition of Example 13 above is first dropped on the surface of reflective film 55 on substrate 51 to form a photopolymerizable resin composition layer by spin coating, and then the photopolymerizable resin composition is cured by UV irradiation.

Figure 2B:
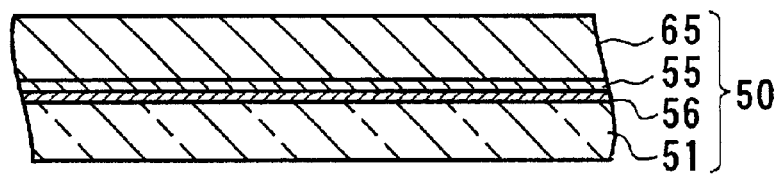

Reference 50 in FIG. 2(b) represents an optical recording medium formed by curing the photopolymerizable resin composition layer, and a protective film (resin layer) 65 consisting of the cured photopolymerizable resin composition layer is provided on the surface of reflective film 55 of optical recording medium 50.

This type of optical recording medium 50 is a so-called CD-R (Compact Disk-Recordable), in which data are recorded by directing a laser beam to the surface of substrate 51 of optical recording medium 50 and condensing the laser beam at a desired spot on pigment layer 56 on the opposite side of substrate 51. The spot on pigment layer 56 at which the laser beam is condensed is heated and discolored (baking).

Figure 2C:
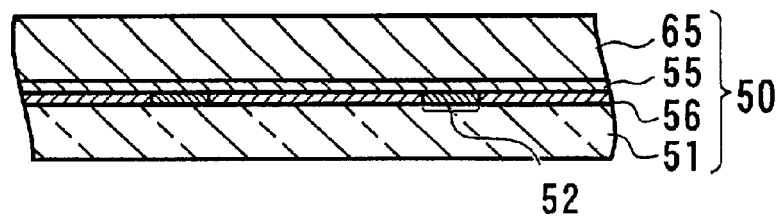

FIG. 2(c) shows pigment layer 56 discolored in a desired pattern, and reference 52 in FIG. 2(c) represents a discolored spot in pigment layer 56. Data are recorded as a pattern of discolored spots 52 in optical recording medium 50.

Figure 2D:
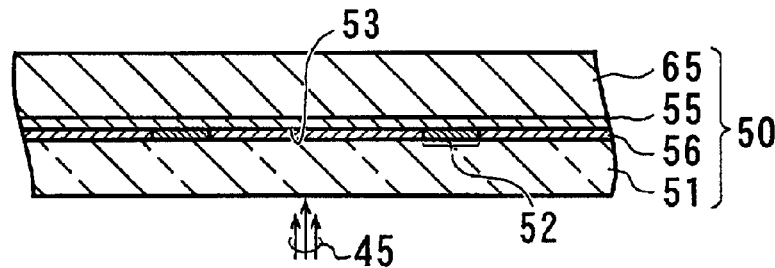

Recorded data are read by directing a laser beam 45 at a predetermined wavelength to the surface of substrate 51 of optical recording medium 50 (FIG. 2(d)) and condensing it on the interface 53 between pigment layer 56 on the opposite side of substrate 51 and reflective film 55 (data reading face).

The data recorded as a pattern of discolored spots 52 can be read by detecting variations in the intensity of the reflected laser beam because the laser beam is reflected at a different reflectance in discolored spots 52 in pigment layer 56 from the remaining area.

Predetermined data were recorded in optical recording medium 50 prepared by the process described above using a data recorder sold under the name of "CRW4260tx" by YAMAHA. Optical recording medium 50 in this state was subjected to a "C1 error rate test" shown below to determine the C1 error rate.

<C1 Error Rate Test>

A CD-ROM analyzer sold under the name of "DR-3755" by KENWOOD TMI was used to detect the C1 error on optical recording medium 50, and the C1 error rate was determined.

Separately, optical recording medium 50 was stored for 200 hours under high temperature/high humidity conditions (80° C., relative humidity 85%) and optical recording medium 50 in this state was measured for C1 error rate value by the same procedure as for the initial value. The results are shown as the value after high temperature/high humidity test in Table 3 below.

TABLE 3

Compositions of photocurable resins and C1 error rate test results

| | | C1 error rate | |
|---|---|---|---|
| | Composition of photocurable resin | Initial value | After high temperature/ high humidity test |
| Example 13 | Photocurable resin composition/ photoinitiator/additive | $2.0 \times 10^{-4}$ | $2.2 \times 10^{-4}$ |
| Comparative Example 12 | Photocurable resin composition/ photoinitiator | $2.0 \times 10^{-4}$ | $4.6 \times 10^{-2}$ |

COMPARATIVE EXAMPLE 12

The same photopolymerizable resin and photoinitiator as used in Example 13 were mixed in the same proportions as in Example 13 with no additives to prepare a photopolymerizable resin composition of Comparative example 12.

Using this photopolymerizable resin composition, a protective film was formed by the same process as in Example 13 on the reflective film on the surface of the substrate in the state shown in FIG. 2(a) to prepare an optical recording medium. This optical recording medium was used to detect the C1 error before and after high temperature/high humidity test under the same conditions as in Example 13, and the C1 error rate was determined. The results are shown in Table 3 above.

As shown in Table 3 above, the C1 error rate value after high temperature/high humidity test was lower in optical recording medium 50 using the photopolymerizable resin composition of Example 13 than using the photopolymerizable resin composition of Comparative example 12. It was confirmed from these results that photopolymerizable resin compositions of the present invention can be used to obtain protective film 60 having the high ability of protecting reflective film 55.

Although the foregoing description relates to the case in which dicyclopentadiene diacrylate, trimethylolpropane triacrylate and tripropylene glycol diacrylate are used as acrylic ester components of the photopolymerizable resin, the present invention is not limited thereto but various acrylates can be used.

Oligomers that can be used in combination with these acrylic esters are not specifically limited, either. Photopolymerizable resin compositions of the present invention may contain various agents such as surface tension modifiers, silane coupling agents, water, etc.

Although Examples 1–12 above relates to examples of optical recording media such as DVD in which either one of first or second reflective film 15, 25 consists of a transmissive metal such as silver and one 11 of first and second substrates 11, 21 on which transmissive reflective film 15 is formed consists of a transparent polycarbonate resin, the present invention is not limited thereto.

For example, both of two reflective films may consist of a non-transparent metal such as aluminum. Data in such an optical recording medium can be read by separately directing a laser beam to both sides of the optical recording medium (the surfaces of first and second substrates) and reading the reflected beam (double-sided reproduction). In this case, both first and second substrates should consist of a transparent material.

Although reflective films 15, 25, 55 consisting of a metal such as silver or aluminum were provided in tight contact with substrates 11, 21, 51 or resin layers 35, 65 in Examples 1–12 above, the present invention is not limited thereto. For example, a dielectric layer consisting of silicon nitride or the like may be formed on at least one of reflective films.

Although Example 13 above relates to an optical recording medium 50 (CD-R) having pigment layer 56 formed on the surface of substrate 51, the present invention is not limited thereto.

Figure 3:
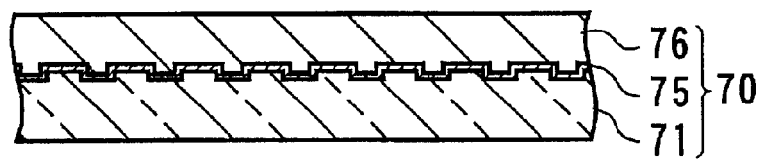
FIG. 3 is a diagram for illustrating a third example of an optical recording medium of the present invention.
Figure 4:
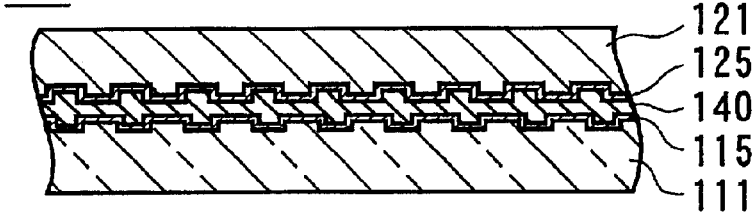
FIG. 4 is a diagram for illustrating an optical recording medium of the prior art.

Reference 70 in FIG. 3 represents a read-only optical recording medium (CD-ROM: Compact Disk Read Only Memory). This optical recording medium 70 comprises a substrate 71, a reflective film 75 provided on the surface of substrate 71 and a protective film 76 provided on the surface of reflective film 75, and protective film 76 consists of a cured product of a photopolymerizable resin composition of the present invention. Similarly to optical recording medium 10 shown in FIG. 1(c), data are recorded as a pattern of pits on the surface of substrate 71 of optical recording medium 70 shown in FIG. 3.

Rewritable optical recording media (CD-RW: Compact Disk Rewritable) having a phase change recording layer in place of pigment layer 56 shown in FIGS. 2(c), 2(d) are also included in the present invention. In these optical recording media (CD-ROM, CD-RW), the reflective films can be prevented from chemical degradation by using a photopolymerizable resin composition of the present invention to form a protective film.

Photopolymerizable resin compositions of the present invention can be used to obtain an optical recording medium with high resistance to moisture and heat even when silver is used as the metal for reflective films.

What is claimed is:

1. A photopolymerizable resin composition, comprising:
   a photopolymerizable resin based on acrylic ester;
   an additive based on at least one selected from the group consisting of
      1,2,3-benzotriazole, methylbenzotriazole, 1-(N,N-bis (2-ethylhexyl)aminomethyl)benzotriazole, carboxybenzotriazole, and 3-(N-salicycloyl)amino-1,2,4-triazole; and
   a photoinitiator.

2. The photopolymerizable resin composition of claim 1, wherein the additive comprises at least 0.01 parts by weight per 100 parts by weight of a total weight of the photopolymerizable resin and the photoinitiator.

3. The photopolymerizable resin composition of claim 1, wherein the additive comprises between 0.05 parts by weight and 5 parts by weight per 100 parts by weight of a total weight of the photopolymerizable resin and the photoinitiator.

4. An optical recording medium, comprising:
   a substrate;
   a first reflective film provided on the substrate; and
   a resin layer provided in tight contact with the first reflective film,
      wherein the resin layer consists of a photopolymerizable resin composition comprising a photopolymerizable resin based on acrylic ester, an additive based on 1,2,3-benzotriazole and a photoinitiator,
      wherein the first reflective film is based on silver.

5. The optical recording medium of claim 4, further comprising a second reflective film in tight contact with a surface of the resin layer opposite to a side with which the first reflective film is in tight contact.

6. The optical recording medium of claim 4, wherein the resin layer has a thickness in a range between 1 $\mu$m and 200 $\mu$m.

7. The optical recording medium of claim 5, wherein the resin layer has a thickness in a range between 1 $\mu$m and 200 $\mu$m.

8. An optical recording medium, comprising:
   a substrate;
   a first reflective film provided on the substrate; and
   a resin layer provided in tight contact with the first reflective film,
      wherein the resin layer consists of a photopolymerizable resin composition comprising a photopolymerizable resin based on acrylic ester, an additive based on a derivative of 1,2,3-benzotriazole, and a photoinitiator,
      wherein the first reflective film is based on silver.

9. The optical recording medium of claim 8, further comprising a second reflective film in tight contact with a surface of the resin layer opposite to a side with which the first reflective film is in tight contact.

10. The optical recording medium of claim 8, wherein the resin layer has a thickness in a range between 1 $\mu$m and 200 $\mu$m.

11. The optical recording medium of claim 9, wherein the resin layer has a thickness in a range between 1 μm and 200 μm.

12. An optical recording medium, comprising:

a substrate;

a first reflective film provided on the substrate; and a resin layer provided in tight contact with the first reflective film;

wherein the resin layer consists of a photopolymerizable resin composition comprising a photopolymerizable resin based on acrylic ester, an additive based on a derivative of 1,2,4-benzotriazole, and a photoinitiator, wherein the first reflective film is based on silver.

13. The optical recording medium of claim 12, further comprising a second reflective film in tight contact with a surface of the resin layer opposite to a side with which the first reflective film is in tight contact.

14. The optical recording medium of claim 12, wherein the resin layer has a thickness in a range between 1 μm and 200 μm.

15. The optical recording medium of claim 13, wherein the resin layer has a thickness in a range between 1 μm and 200 μm.

* * * * *